United States Patent
Chen et al.

(10) Patent No.: US 10,326,406 B2
(45) Date of Patent: Jun. 18, 2019

(54) AMPLIFIER DEVICE (71) Applicant: RICHWAVE TECHNOLOGY CORP., Taipei (TW)

(72) Inventors: Chih-Sheng Chen, Taipei (TW); Hong-Jia Lo, Taipei (TW)

(73) Assignee: RichWave Technology Corp., Taipei (TW)

(*) Notice: Subject to any disclaimer, the term of this patent is extended or adjusted under 35 U.S.C. 154(b) by 0 days.

(21) Appl. No.: 15/718,079

(22) Filed: Sep. 28, 2017

(65) Prior Publication Data

US 2018/0191308 A1    Jul. 5, 2018

(30) Foreign Application Priority Data

Dec. 30, 2016 (TW) .............................. 105144234 A (51) Int. Cl.
| | | |
|---|---|---|
| H03F 1/02 | (2006.01) | |
| H03F 1/56 | (2006.01) | |
| H03F 3/21 | (2006.01) | |
| H03F 3/19 | (2006.01) | |

(52) U.S. Cl.
CPC ............ *H03F 1/0216* (2013.01); *H03F 1/56* (2013.01); *H03F 3/19* (2013.01); *H03F 3/21* (2013.01); *H03F 2200/294* (2013.01); *H03F 2200/451* (2013.01); *H03F 2200/555* (2013.01)

(58) Field of Classification Search
USPC .................................. 330/285, 296, 289, 136
See application file for complete search history.

(56) References Cited

U.S. PATENT DOCUMENTS

| | | | |
|---|---|---|---|
| 5,422,522 A | 6/1995 | Rotay | |
| 7,692,490 B2* | 4/2010 | Cho | ...................... H03F 1/0266 |
| | | | 330/296 |
| 2004/0189399 A1 | 9/2004 | Hu | |
| 2007/0024370 A1* | 2/2007 | Hirata | ...................... H03F 1/30 |
| | | | 330/285 |
| 2009/0072906 A1 | 3/2009 | Tsurumaki | |
| 2009/0251220 A1 | 10/2009 | Matsuda | |
| 2015/0194940 A1 | 7/2015 | Briffa | |
| 2016/0276981 A1 | 9/2016 | Kang | |

* cited by examiner

*Primary Examiner* — Hieu P Nguyen (74) *Attorney, Agent, or Firm* — Winston Hsu (57) ABSTRACT

An amplifier device includes an amplifying unit, a bias module and an impedance unit. A first end of the amplifying unit electronically connects to a voltage source. A second end of the amplifying unit receives an input signal. The first end of the amplifying unit outputs an output signal amplified by the amplifying unit. A third end of the amplifying unit connects to a first reference potential. The bias module electrically connects to the second end of the amplifying unit for providing a bias voltage to the amplifying unit. An impedance unit is electrically connects to the bias module. An impedance value of the impedance unit is variable. The bias module adjusts the amplifier's linearity according to a frequency value of the input signal, a voltage value of the voltage source or a temperature value of the amplifier device. The impedance is adjusted according to the above-mentioned values.

18 Claims, 9 Drawing Sheets

AMPLIFIER DEVICE

CROSS-REFERENCE TO RELATED APPLICATION

This application claims priority of Taiwan application No. 105144234, which was filed on Dec. 30, 2016, and is included herein by reference.

TECHNICAL FIELD

The present disclosure relates to an amplifier device; in particular, to an amplifier device capable of improving linearity.

BACKGROUND

With the prevalence of mobile devices nowadays, amplifier devices are used in communication modules in great quantity. Due to the fact that the power-gain curve and power-phase curve of an amplifier device tend to be non-linear when they reach a certain level, amplifier devices are limited in power usage. Though the approaches of reducing the power or introducing a pre-distortion circuit may be utilized, the complexity of circuit design and cost would increase correspondingly. Moreover, the linearity of an amplifier device varies according to the input signal, voltage source or temperature, so that if a pre-distortion circuit is utilized as previously described, different control factors need thus be considered, and the circuit design would also become more complicated.

Therefore, providing an amplifier device with simple circuit and capable of self-adjusting linearity becomes a critical issue.

SUMMARY

An amplifier device is provided in one of the embodiments of the present disclosure. The amplifier device includes an amplifying unit having a first end, a second end and a third end, in which the first end of the amplifying unit is configured for electrically connecting to a voltage source, the second end of the amplifying unit is configured for receiving an input signal, the first end of the amplifying unit is configured for outputting an output signal amplified by the amplifying unit, and the third end of the amplifying unit is configured for electrically connecting to a first reference potential; a bias module electrically connected to the second end of the amplifying unit for providing a bias voltage to the amplifying unit; and an impedance unit electrically connected to the bias module, in which an impedance value of the impedance unit is variable. The bias module adjusts a linearity of the amplifier device according to a frequency value of the input signal, a voltage value of the voltage source or a temperature value of the amplifier device, and the impedance value of the impedance unit is adjusted according to the frequency value of the input signal, the voltage value of the voltage source or the temperature value of the amplifier device.

An amplifier device is provided in one of the embodiments of the present disclosure. The amplifier device includes an amplifying unit having a first end, a second end and a third end, in which the first end of the amplifying unit is configured for electrically connecting to a voltage source, the second end of the amplifying unit is configured for receiving an input signal, the first end of the amplifying unit is configured for outputting an output signal amplified by the amplifying unit, and the third end of the amplifying unit is configured for electrically connecting to a first reference potential; a bias module electrically connected to the second end of the amplifying unit for providing a bias voltage to the amplifying unit; and an impedance unit electrically connected to the bias module, in which an impedance value of the impedance unit is variable. A voltage value of the voltage source is variable, and the impedance value of the impedance unit is adjusted according to a frequency value of the input signal, the voltage value of the voltage source or a temperature value of the amplifier device.

An amplifier device is provided in one of the embodiments of the present disclosure. The amplifier device includes an amplifying unit having a first end, a second end and a third end, in which the first end of the amplifying unit is configured for electrically connecting to a voltage source, the second end of the amplifying unit is configured for receiving an input signal, the first end of the amplifying unit is configured for outputting an output signal amplified by the amplifying unit, and the third end of the amplifying unit is configured for electrically connecting to a first reference potential; a bias module electrically connected to the second end of the amplifying unit for providing a bias voltage to the amplifying unit; and an impedance unit electrically connected to the bias module, in which an impedance value of the impedance unit is variable. The bias module includes a power element and a first bias element. The power element has a first end, a second end and a third end, in which the first end of the power element is configured for electrically connecting to a bias voltage source, and the third end of the power element is connected to the second end of the amplifying unit. The first bias element has a first end and a second end, in which the first end of the bias element is configured for electrically connecting to a reference power module, the second end of the first bias element is electrically connected to the second end of the power element and is configured for providing a variable current to the second end of the power element. The impedance value of the impedance unit and the current value of the variable current are adjusted according to a power of the input signal, a power of the output signal or an operation mode of the amplifier device, to adjust a linearity of the amplifier device In order to further the understanding regarding the present disclosure, the following embodiments are provided along with illustrations to facilitate the disclosure of the present disclosure.

DETAILED DESCRIPTION

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 1:
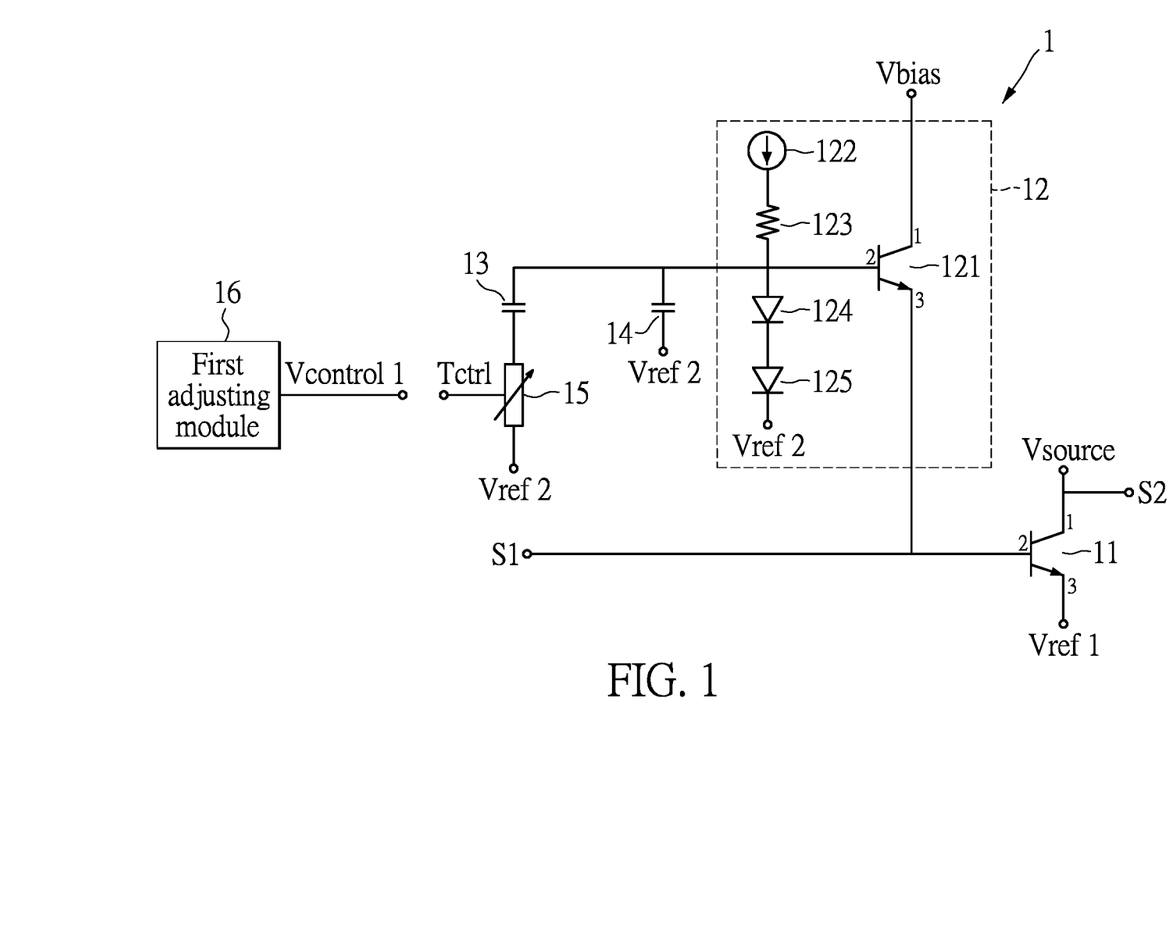
FIG. 1 shows a diagram of an amplifier device according to an embodiment of the present disclosure.
Figure 2:
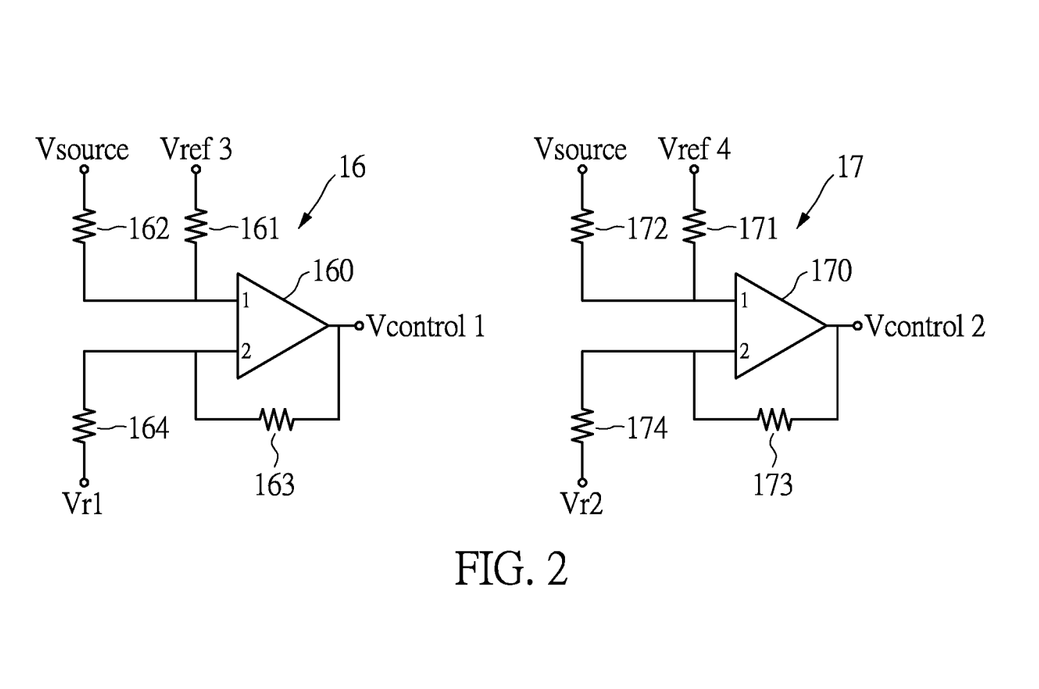
FIG. 2 shows a diagram of a first adjusting module and a second adjusting module according to an embodiment of the present disclosure.
Figure 3A:
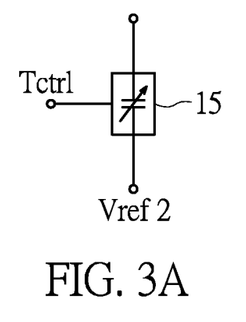
FIGS. 3A-3Y show diagrams of an impedance unit implemented by different elements according to the embodiments of the present disclosure.
Figure 3B:
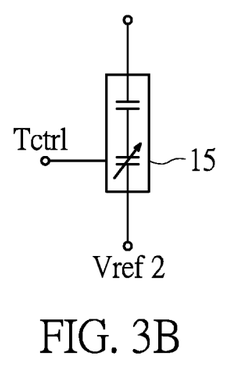
Figure 3C:
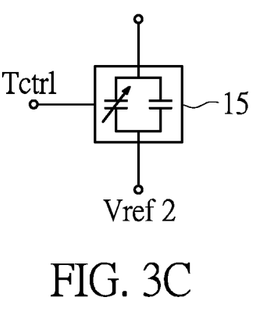
Figure 3D:
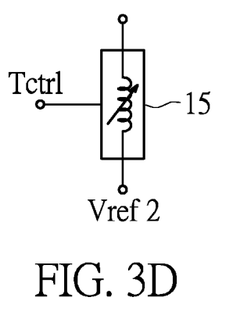
Figure 3E:
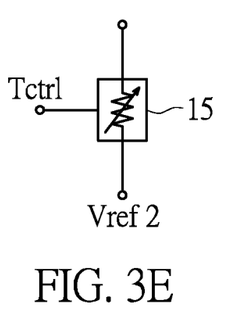
Figure 3F:
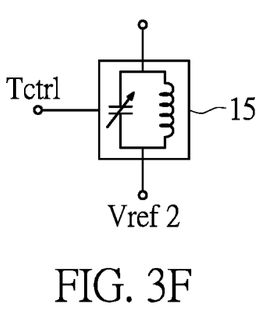
Figure 3G:
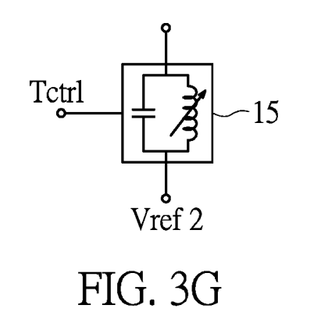
Figure 3H:
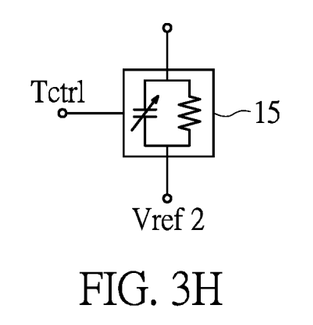
Figure 3I:
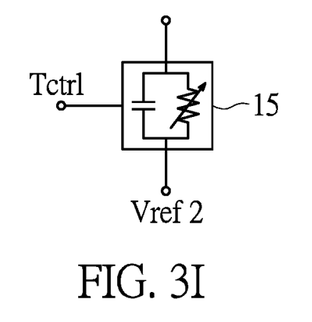
Figure 3J:
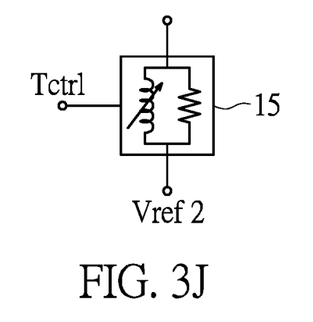
Figure 3K:
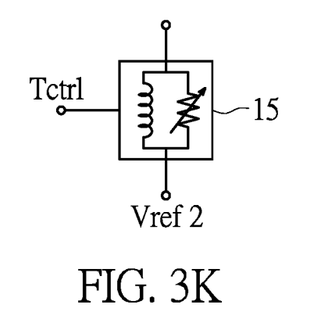
Figure 3L:
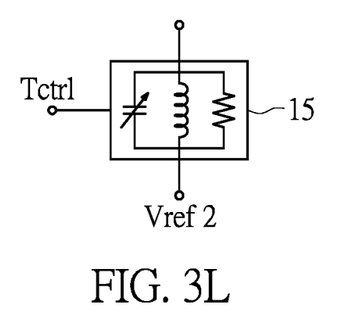
Figure 3M:
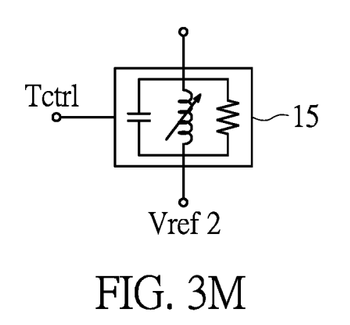
Figure 3N:
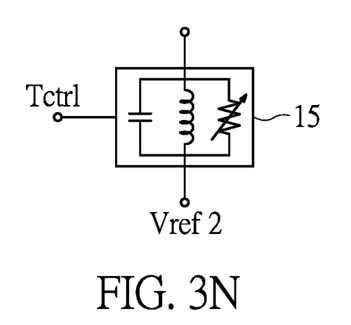
Figure 3O:
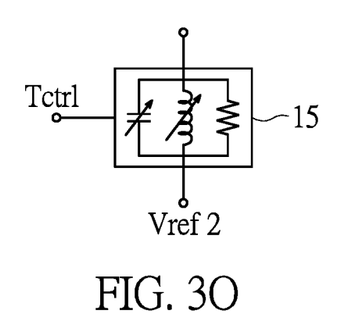
Figure 3P:
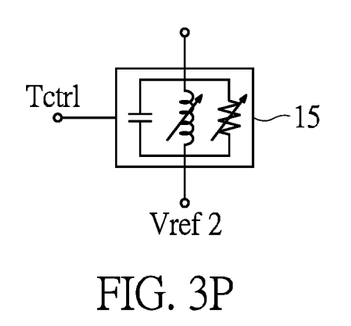
Figure 3Q:
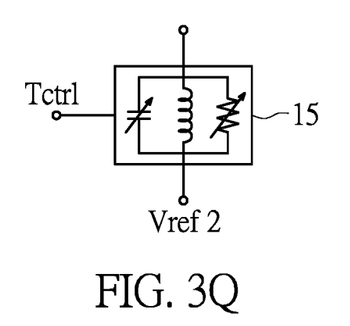
Figure 3R:
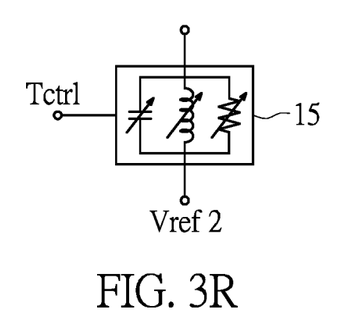
Figure 3S:
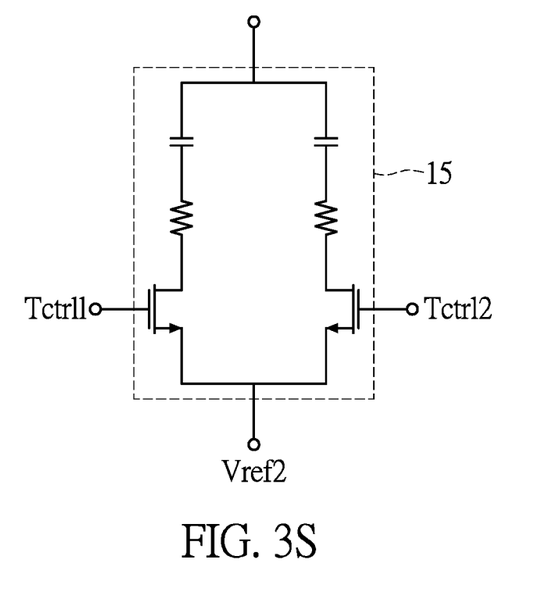
Figure 3T:
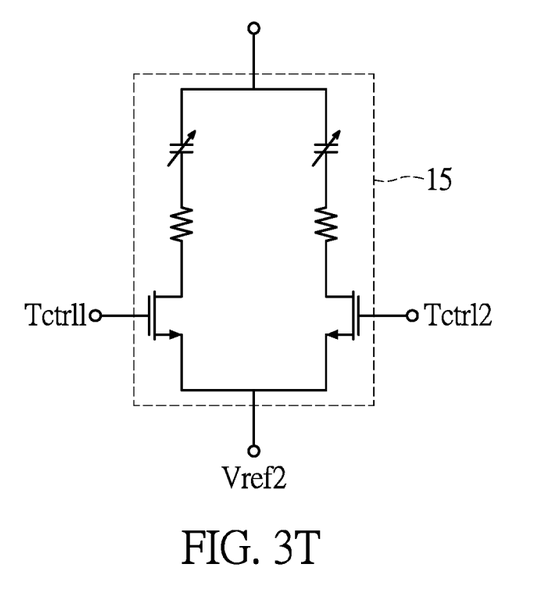
Figure 3U:
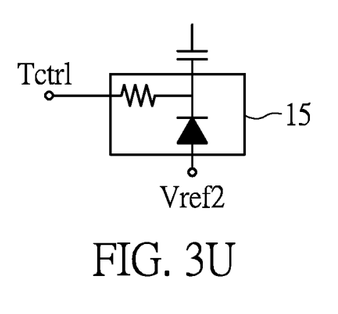
Figure 3V:
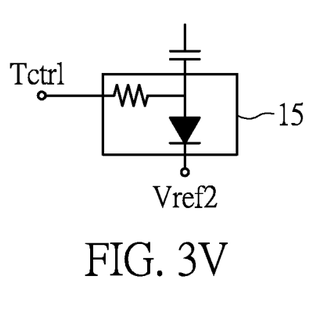
Figure 3W:
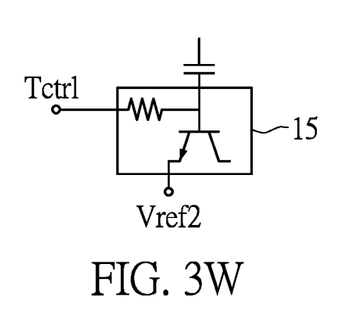
Figure 3X:
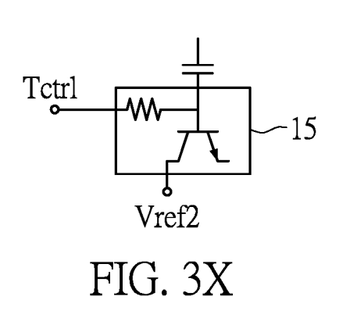
Figure 3Y:
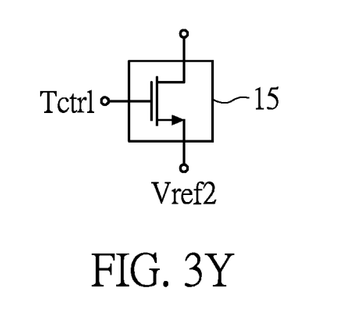

Reference is made to FIG. 1, FIG. 2 and FIGS. 3A-3Y, where FIG. 1 shows a diagram of an amplifier device according to an embodiment of the present disclosure, FIG. 2 shows a diagram of a first adjusting module and a second adjusting module according to an embodiment of the present disclosure, and FIGS. 3A-3Y show diagrams of an impedance unit implemented by different elements according to the embodiments of the present disclosure.

In the following description, for the sake of brevity, for elements with two ends in FIG. 1 and FIG. 2, the upper end would be the first end and the lower end would be the second end if an element is placed vertically, and the left end would be the first end and the right end would be the second end if an element is placed horizontally. For elements with three or more ends in FIG. 1 and FIG. 2, reference in the description would be made according to the end number as labeled in the figures.

The amplifier device 1 includes an amplifying unit 11 and a bias module 12. The amplifying unit 11 includes a first end, a second end and a third end. The first end of the amplifying unit 11 connects to a voltage source Vsource, the second end of the amplifying unit 11 receives an input signal S1, the first end of the amplifying unit 11 is configured for outputting an output signal S2 amplified by the amplifying unit, the third end of the amplifying unit 11 connects to a first reference potential Vref1. In the present embodiment, the amplifying unit 11 may be a bipolar junction transistor (BJT), and the voltage source Vsource is provided by a battery, with the voltage value being variable, e.g., time-varying. The amplifier device 1 may be installed in a mobile device (not shown in the figures), and may use the battery of the mobile device to provide the voltage source Vsource. The amplifier device 1 may be, such as, a power amplifier or a low noise amplifier, and a power amplifier is taken as exemplary in the present embodiment. Moreover, the input signal S1 and the output signal S2 may be AC signal, such as radio frequency (RF) signal.

The bias module 12 includes a power element 121, a reference power module 122, a first bias element 123, a second bias element 124 and a third bias element 125. The power element 121 has a first end, a second end and a third end. The first end of the power element 121 electrically connects to a bias voltage source Vbias, the third end of the power element 121 connects to the second end of the amplifying unit 11. The bias module 12 adjusts a linearity of the amplifier device 1 according to a frequency value of the input signal S1, a voltage value of the voltage source Vsource or a temperature value of the amplifier device 1. In the present embodiment, the bias voltage source Vbias and the voltage source Vsource may or may not have the same potential, and is not limited to either circumstance by the present disclosure.

The first bias element 123 has a first end and a second end. The first end of the first bias element 123 electrically connects to the reference power module 122, the second end of the first bias element 123 electrically connects to the second end of the power element 121. The second bias element 124 has a first end and a second end, and the first end of the second bias element 124 electrically connects to the second end of the first bias element 123. In the present embodiment, the reference power module 122 is a current source which provides a reference current to the first bias element 123 of the bias module 12. In other embodiments the reference power module 122 may be a voltage source or power modules with other kinds of power supplying.

The third bias element 125 has a first end and a second end, the first end of the third bias element 125 electrically connects to the second end of the second bias element 124, the second end of the third bias element 125 electrically connects to a second reference potential Vref2 or other reference potentials, and is not limited by the present disclosure.

In the present embodiment, the amplifier device 1 further includes a first default capacitor 13, a second default capacitor 14, an impedance unit 15 and a first adjusting module 16, so as to adjust the linearity of the amplifier device 1.

The first default capacitor 13 has a first end and a second end, and the first end of the first default capacitor 13 electrically connects to the bias module 12. In the present embodiment, the first end of the first default capacitor 13 electrically connects to the second end of the power element 121, the second end of the first bias element 123 and the first end of the second bias element 124. The second end of the first default capacitor 13 connects to the impedance unit 15. The first default capacitor 13 can be used to block DC (direct current) signal.

The second default capacitor 14 has a first end and a second end. The first end of the second default capacitor 14 connects to the first end of the first default capacitor 13, and the second end of the second default capacitor 14 electrically connects to the second reference potential Vref2. The second default capacitor 14 can be used to block DC (direct current) signal.

In the present embodiment, the power element 121 may be, such as a bipolar junction transistor (BJT), the first element 123 is a resistor, and the second bias element 124 and the third bias element 125 are respectively a diode. In the present embodiment, the second bias element 124 and the third bias element 125 may be, but not limited to, a diode composed of a p-type semiconductor or an n-type semiconductor, e.g., a diode composed of bipolar junction transistor (BJT). In other embodiments, the second bias element 124 and the third bias element 125 may be other elements, or be replaced by equivalent circuit such as a metal-oxide-semiconductor field-effect transistor (MOSFET).

In the present embodiment, since the bias module 12, the second default capacitor 14 and the impedance 15 are often disposed in the same vicinity in circuit design, the second default capacitor 14, the impedance unit 15 and the third bias element 125 may be all electrically connected to the second reference potential Vref2 as a common reference potential. In the present embodiment, the first reference potential Vref1 and the second reference potential Vref2 may be, but are not limited to, a ground potential or other reference potentials. Moreover, in the present embodiment, the reference power module 122 may be a variable current source, a constant voltage source or a variable voltage source, and current value of a reference current provided by the variable current source or voltage value of a reference voltage provided the variable voltage source may be adjusted according to a frequency value of the input signal S1, the voltage value of the voltage source Vsource or a temperature value of the amplifier device 1, so as to adjust the bias voltage provided by the bias module 12 to the amplifying unit 11. Comparing to the amplifier device that only has the amplifying unit 11 and the bias module 12, the second capacitor 14 can be used to change the impedance viewed from the second terminal of the power element 121 to the external, such as the impedance to the AC signal, and the first default capacitor 13 and the impedance unit 15 can be further used to dynamically adjust the impedance viewed from the second terminal of the power element 121 to the external of the power element 121.

In the present embodiment, the impedance value of the impedance unit 15 is variable, and by serially connecting the impedance unit 15 with the first default capacitor 13, the equivalent impedance resulted from the first default capacitor 13 and the impedance unit 15 can be adjusted. In the present embodiment, the impedance unit 15 may be a variable resistor, a variable capacitor, a variable inductor, a switch or other equivalent circuit or electronic device capable of adjusting impedance value, such as a varactor, or the combination of the above-mentioned elements. The impedance unit 15 further includes an impedance control end Tctrl, which may receive a control signal. In the present embodiment, the amplifier device 1 further includes a first adjusting module 16, configured to provide a first adjusting signal (e.g., the first adjusting voltage Vcontrol1) to the control end Tctrl of the impedance unit 15, for adjusting the impedance value of the impedance unit 15. In other embodiments, the impedance value of the impedance unit 15 may be adjusted according to a frequency value of the input signal S1, the voltage value of the voltage source Vsource or the temperature value of the amplifier device 1.

The first adjusting module 16 includes a first amplifier 160, a first resistor 161, a second resistor 162, a third resistor 163 and a fourth resistor 164. The first amplifier 160 has a first input end, a second input end and an output end. The first resistor 161 is connected between the first end of the first amplifier 160 and a third reference potential Vref3. The second resistor 162 connects the first input end of the first amplifier 160 and the voltage source Vsource. The third resistor 163 is connected between the second input end of the first amplifier 160 and the output end of the first amplifier 160. The fourth resistor 164 is connected between the first reference voltage Vr1 and the second input end of the first amplifier 160. In the present embodiment, the output end of the first amplifier 160 of the first adjusting module 16 outputs a first adjusting voltage Vcontrol1 to adjust the impedance value of the impedance unit 15, i.e., the output end of the first amplifier 160 of the first adjusting module 16 electrically connects to the control end Tctrl of the impedance unit 15. In the present embodiment, the third reference potential Vref3 is a ground potential, i.e., 0V. In other embodiments, the third reference voltage Vref3 may be other reference potentials.

In the present embodiment, the first adjusting module is a differential amplifier architecture, thus the first adjusting voltage Vcontrol1 may be calculated and obtained according to the voltage value of the voltage source, the first reference voltage Vr1, the third reference potential Vref3, the impedance value of the first resistor 161, the impedance value of the second resistor 162, the impedance value of the third resistor 163 and the impedance value of the fourth resistor 164. In the present embodiment, the third reference potential Vref3 is 0V, and thus the first adjusting voltage Vcontrol1 may be represented by the following equation 1:

$$Vcontrol1 = \frac{R1}{R1+R2} * \left(1 + \frac{R3}{R4}\right) * Vsource - \frac{R3}{R4} * Vr1 \quad \text{Equation 1}$$

In the equation above, R1 is the impedance value of the first resistor 161, R2 is the impedance value of the second resistor 162, R3 is the impedance value of the third resistor 163 and R4 is the impedance value of the fourth resistor 164. Vcontrol1 represents the first adjusting voltage and Vr1 represents the first reference voltage.

According to equation 1, if the impedance value of the first resistor 161 equals to the impedance value of the third resistor 163 and the impedance value of the second resistor 162 equals to the impedance value of the fourth resistor 164, equation 1 may be simplified to equation 2:

$$Vcontrol1 = (Vsource - Vr1) * \left(\frac{R1}{R2}\right) \quad \text{Equation 2}$$

In the present embodiment, the first reference voltage Vr1 is a constant, with only the voltage value of the voltage source being variable, and the impedance values of each resistor are also constant, which means that the first adjusting voltage Vcontrol1 is a function value of the voltage source Vsource. In other embodiments, other kinds of circuit may be utilized for the design of the first adjusting voltage Vcontrol1, so long as the voltage source Vsource is the main variable of the first adjusting voltage Vcontrol1.

In the present embodiment, the impedance value of the impedance unit 15 is adjusted according the voltage value of the voltage source Vsource, which means, based on the voltage value of the voltage source Vsource, adjusting the equivalent impedance seen from the third end of the power element 121 to the internal of the power element 121, and further adjusting the bias voltage provided by the bias module 12 to the amplifying unit 11. In other embodiments, the impedance value of the impedance unit 15 may be adjusted according to the a frequency value of the input signal S1 or other parameters, so as to further adjust the bias voltage provided by the bias module 12 to the amplifying unit 11. For example, a frequency-voltage conversion circuit may first be used to detect the frequency of an input signal, the frequency is then converted into a voltage value, and then the impedance value of the impedance unit 15 may be adjusted by using the voltage value. In other embodiments, the amplifier device 1 may include a temperature sensor (not shown in the figures) for detecting the temperature of the amplifier device 1. The impedance value of the impedance unit 15 may be adjusted according to the temperature of the amplifier device 1, so as to further adjust the bias voltage provided by the bias module 12 to the amplifying unit 11. In summary, in the embodiments of the present disclosure, the equivalent impedance seen from the third end of the power element 121 to the internal of the power element 121 may be adjusted according to the voltage value of the voltage source Vsource, a frequency value of the input signal S1 and the temperature of the amplifier device 1.

In the present embodiment, the first adjusting module 16, based on the variation of the voltage source Vsource, adjusts the impedance value of the impedance unit 15. Therefore, the impedance seen outwardly from the second end of the power element 121 of the bias module 12 may be adjusted, which effects the equivalent impedance seen from the third end of the power element 121 to the internal of the power element 121, further adjusts the bias voltage provided bias module 12 to the amplifying unit, and effects the linearity of the power-gain curve or the power-phase curve of the amplifying unit 11.

In the present embodiment, the impedance unit 15 may be that shown by the diagrams in FIGS. 3A-3Y, and may be, but not limited to, designed by using different resistors, capacitors, inductors, variable resistors, variable capacitors, variable inductors, switch elements (e.g., transistors or diodes), or the combination thereof.

[Embodiment of Amplifier Device with Two Adjusting Modules]

In the present embodiment, the amplifier device 1 further includes a second adjusting module 17. The second adjusting module 17 includes a second amplifier 170, a fifth resistor 171, a sixth resistor 172, a seventh resistor 173 and an eighth resistor 174. The second amplifier 170 has a first input end, a second input end and an output end. The fifth resistor 171 is connected between the first input end of the second amplifier 170 and a fourth reference potential Vref4. The sixth resistor 172 is connected between the first input end of the second amplifier 170 and the voltage source Vsource. The seventh resistor 173 is connected between the second input end of the second amplifier 170 and the output end of the second amplifier 170. The eighth resistor is connected between a second reference voltage Vr2 and the second input end of the second amplifier 170.

In the present embodiment, the varying interval of the voltage source Vsource is divided into two intervals, which means that the voltage source Vsource has a first voltage interval and a second voltage interval. When the voltage value of the voltage source Vsource is within the first voltage interval, the first adjusting module 16 provides a first adjusting voltage to adjust the impedance value of the impedance unit 15, and when the voltage value of the voltage source Vsource is within the second voltage interval, the second adjusting module 17 provides a second adjusting signal (e.g., a second adjusting voltage) to adjust the impedance value of the impedance unit 15. In the present embodiment, both the output end of the first amplifier 160 of the first adjusting module 16 and the output end of the second amplifier 170 of the second adjusting module 170 electrically connect to the control end Tctrl of the impedance unit 15. In other embodiments, a user may set the first reference voltage Vr1 and the second reference voltage Vr2 for the setting of the first voltage interval and the second voltage interval. In the present embodiment, the first adjusting voltage Vcontrol1 and the second adjusting voltage Vcontrol2, as described in the previous paragraph, are both a function value of the voltage source Vsource. In other embodiments, other circuits may be utilized for the design of the first adjusting voltage Vcontrol1 and the second adjusting voltage Vcontrol2, so long as the voltage source Vsource is the main variable of the first adjusting voltage Vcontrol1 and the second adjusting voltage Vcontrol2, the designs thereof not being limited to the above description.

In the present embodiment, the third reference potential Vref3 and the fourth reference potential Vref4 may be, but not limited to, a ground potential or other reference potentials.

In other embodiments, the first adjusting voltage Vcontrol1 of the first adjusting module 16 may electrically connect to the first impedance control end Tctrl1 as shown in FIG. 3S or FIG. 3T, the second adjusting voltage Vcontrol2 may electrically connect to the second impedance control and Tctrl2 as shown in FIG. 3S or FIG. 3T. A designer, by different practical demands, and according to the resistor-capacitor combination as shown in FIG. 3S or FIG. 3T, may select different resistances or capacitances to generate different equivalent impedances.

In other embodiments, the voltage-varying interval of the voltage source Vsource may be divided into more intervals, and the number of the adjusting modules should be increased accordingly to provide adjusting voltages.

Figure 4:
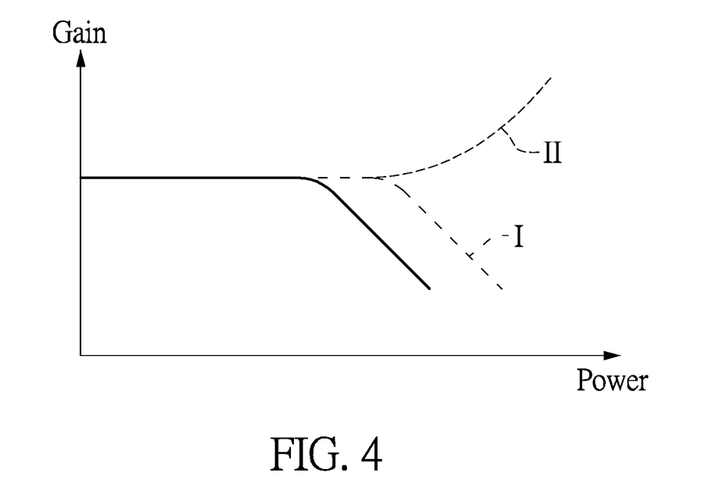
FIG. 4 shows a diagram of a power-gain curve of an amplifier device.
Figure 5:
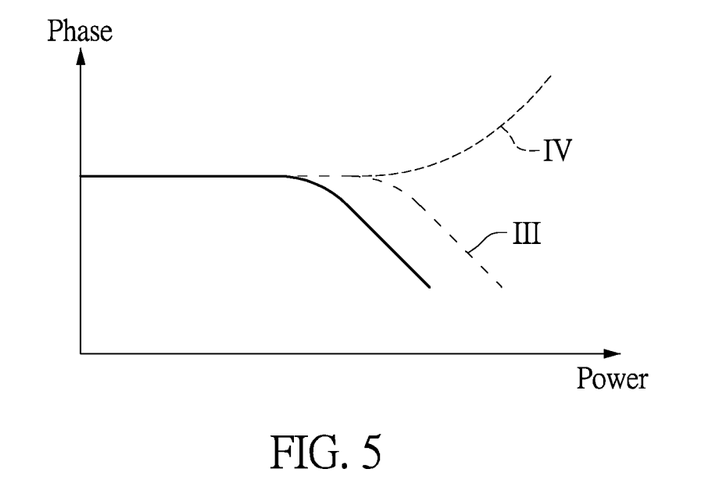
FIG. 5 shows a diagram of a power-phase curve of an amplifier device.

Reference is made to FIG. 4 and FIG. 5, where FIG. 4 shows a diagram of a power-gain curve of an amplifier device and FIG. 5 shows a diagram of a power-phase curve of an amplifier device.

The solid line as shown in FIG. 4 is the power-gain curve of an uncompensated amplifier device. In general, when the power of an uncompensated amplifier device exceeds a predetermined value, the gain curve extends downwardly and nonlinearly as shown in FIG. 4. After that, if a pre-distortion circuit or other compensation circuit is introduced, it would be shown as the dotted line I and the dotted line II in FIG. 4, where the dotted line I represents the gain linear area being drawn to higher power after the amplifier device is bias compensated, and when under higher power, the gain curve extends downwardly. The dotted line II represents, after the amplifier device is bias compensated, the linear area of the adjusted gain curve being not only drawn further, but also extended upwardly according to practical demand.

The solid line as shown in FIG. 5 is the power-phase curve of an amplifier device not being bias compensated. As shown in FIG. 5, when the power is lower, the power-phase curve extends linearly, when the power increases to a predetermined value however, the power-phase curve starts to extend downwardly, and distortion occurs at the output end of the amplifier device. The dotted line III and the dotted line IV in FIG. 5 are the power-phase curve adjusted according to different demands of the amplifier device 1 according to an embodiment of the present disclosure. Therefore, a user may compensate the linearity of the amplifier device 1 according to different factors, so as to increase the linearity of the amplifier device 1 effectively.

Figure 6:
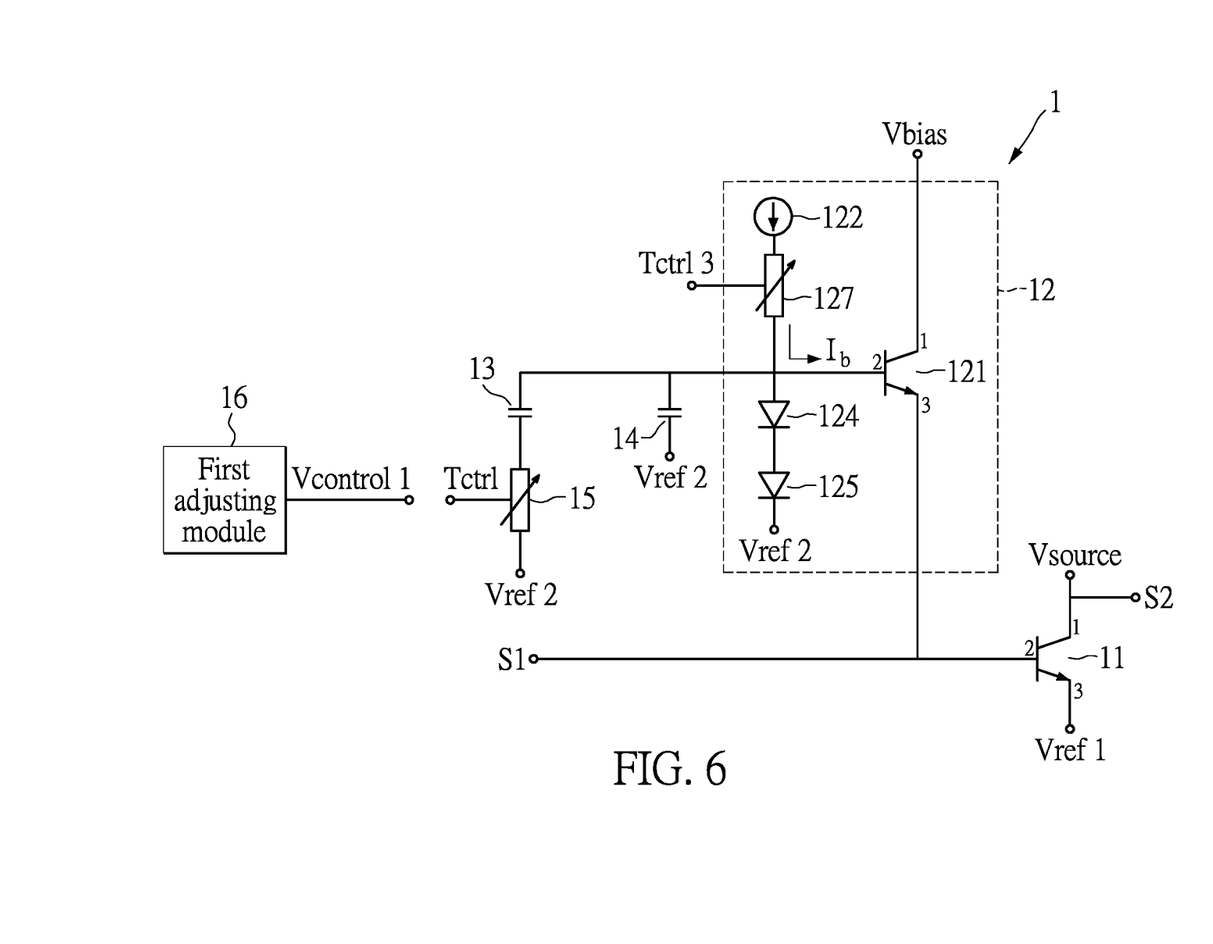
FIG. 6 shows a diagram of an amplifier device according to another embodiment of the present disclosure.

Reference is made to FIG. 6, which shows a diagram of an amplifier device according to another embodiment of the present disclosure. In the present embodiment, the amplifier device 1 as shown in FIG. 6 is similar to the amplifier device 1 as shown in FIG. 1, one of the differences is that the first bias element 123 of the amplifier device 1 of FIG. 1 is replaced by a first bias element 127. In the present embodiment, the first bias element 127 may be a variable resistor. The first bias element 127 has a third control end Tctrl3 electrically connected with the first adjusting module 16. Furthermore, in the present embodiment, the voltage source Vsource may have a constant voltage value.

In the present embodiment, when the power of the input signal S1 and the output signal S2 are changed, or the operation mode of the amplifying unit 11 is adjusted between a high power operation mode and a low power operation mode, a variable current $I_b$, which flows into the second end of the power element 121 of the bias module 12 through the first bias element 127 from the reference power module 122 would be changed. For example, when the operation mode of the amplifying unit 11 is adjusted from the high power operation mode to the low power operation mode, the variable current $I_b$ would be decreased. In the meantime, the impedance value of the impedance unit 15 will be adjusted simultaneously in accordance with the corresponding linearity. Therefore, in the present embodiment, the linearity of the frequency-phase curve can be adjusted accordingly. That is to say, in the present embodiment, the variable current of the first bias element 127 and the impedance value of the impedance unit 15 are taken as the main factors of the first adjusted voltage Vcontrol1.

Therefore, in the present embodiment, the first adjusting module 16 can, according to the power of the input signal S1 and the output signal S2 or the operation mode of the amplifier device, output a first adjusting voltage Vcontrol1, and by adjusting the impedance value of the impedance unit

15 over the first control end Tctrl and the third control end Tctrl3, and by the variable current $I_b$ flows through the first bias element 127, the linearity of the amplifier device 1 can be adjusted.

In other embodiments such as shown in FIG. 3Y, the impedance unit 15 includes a switch element. When the operation mode of the amplifying unit 11 is changed (e.g., the operation mode of the amplifying unit 11 is adjusted between a high power operation mode and a low power operation mode), the first adjusting module 16 can, according to the operation mode of the amplifier device, outputs the first adjusting voltage Vcontrol1 corresponding to the operation mode, by controlling the switch element of the impedance unit 15 to be connected or disconnected through the first control end Tctrl1 and the third control end Tctrl3, and the variable current $I_b$ passing through the first bias element 127, an impedance value matching the operation mode can be provided, which further improves the linearity of the amplifier device.

The amplifier devices as provided in some of the preset disclosure are capable of output adjustment for bias modules according to different linearity factors, and are capable of bias compensation for amplifier devices according to the voltage value of a voltage source, the frequency value of an input signal or a temperature value. The other amplifier devices as provided in some of the preset disclosure are capable of impedance adjustment according to a power of the input signal, a power of the output signal or a operation mode of the amplifying unit. Therefore, the linearity or the tendency of the power-gain curve or the power-phase curve of an amplifier device may be adjusted accordingly to meet with practical demands.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An amplifier device, comprising:
    an amplifying unit having a first end, a second end and a third end, wherein the first end of the amplifying unit is configured for electrically connecting to a voltage source, the second end of the amplifying unit is configured for receiving an input signal, the first end of the amplifying unit is configured for outputting an output signal amplified by the amplifying unit, and the third end of the amplifying unit is configured for electrically connecting to a first reference potential;
    a bias module electrically connected to the second end of the amplifying unit for providing a bias voltage to the amplifying unit;
    an impedance unit electrically connected to the bias module and received a control signal to make an impedance value of the impedance unit variable; and
    a first adjusting module comprising:
        a first amplifier having a first input end, a second input end and an output end;
        a first resistor being connected between the first input end of the first amplifier and a third reference potential;
        a second resistor being connected between the first input end of the first amplifier and the voltage source;
        a third resistor being connected between the second input end of the first amplifier and the output end of the first amplifier; and
        a fourth resistor being connected between the first reference voltage and the second input end of the first amplifier;
        wherein the output end of the first amplifier outputs an output voltage as the control signal according to the voltage source and the first reference voltage to adjust the impedance value of the impedance unit;
    wherein the bias module adjusts a linearity of the amplifier device according to a voltage value of the voltage source.

2. The amplifier device according to claim 1, wherein a voltage value of the voltage source is variable, and the bias module provides the bias voltage according to the voltage value to adjust the linearity of the amplifier device.

3. The amplifier device according to claim 1, wherein the bias module includes:
    a power element having a first end, a second end and a third end, wherein the first end of the power element is configured for electrically connecting to a bias voltage source, the third end of the power element is electrically connecting to the second end of the amplifying unit;
    a first bias element having a first end and a second end, the first end of the bias element is configured for electrically connecting to a reference power module, wherein the second end of the first bias element is electrically connected to the second end of the power element;
    a second bias element having a first end and a second end, wherein the first end of the second bias element is electrically connected to the second end of the first bias element; and
    a third bias element having a first end and a second end, the first end of the third bias element is electrically connected to the second end of the second bias element, wherein the second end of the third bias element is configured for electrically connecting to a second reference potential.

4. The amplifier device according to claim 1, wherein the bias module further includes a reference power module for providing a reference current to the bias module, and wherein the reference power module is configured for adjusting the reference current to output the bias voltage according to the frequency value of the input signal, the voltage value of the voltage source or the temperature value of the amplifier device.

5. The amplifier device according to claim 1, further comprising a second adjusting module:
    the second adjusting module including:
        a second amplifier having a first input end, a second input end and an output end;
        a fifth resistor being connected between the first input end of the second amplifier and a fourth reference potential;
        a sixth resistor being connected between the first input end of the second amplifier and the voltage source;
        a seventh resistor being connected between the second input end of the second amplifier and the output end of the second amplifier; and
        an eighth resistor being connected between a second reference voltage and the second input end of the second amplifier;
    wherein the voltage value of the voltage source is variable and has a first voltage interval and a second voltage interval, when the voltage value of the voltage source is within the first voltage interval, the first adjusting module provides a first adjusting voltage to adjust the impedance value of the impedance unit, and when the voltage value of the voltage source is within the second voltage interval, the second adjusting module provides a second adjusting voltage to adjust the impedance value of the impedance unit.

6. The amplifier device according to claim 1, further comprising:
a first default capacitor having a first end and a second end, wherein the first end of the first default capacitor is electrically connected to the bias module, the second end of the first default capacitor is connected to the impedance unit;
wherein an impedance value of the impedance unit is variable, the impedance value of the impedance unit is adjusted according to the frequency value of the input signal, the voltage value of the voltage source or the temperature value of the amplifier device.

7. The amplifier device according to claim 6, further comprising a second default capacitor having a first end and a second end, wherein the first end of the second default capacitor is connected to the first end of the first default capacitor, the second end of the second default capacitor is configured for electrically connecting to a second reference potential.

8. The amplifier device according to claim 1, wherein the voltage source is provided by a battery.

9. The amplifier device according to claim 1, wherein the impedance unit includes a variable capacitor, a variable resistor, a variable inductor or a switch element.

10. The amplifier device according to claim 1, wherein the amplifying unit is a bipolar junction transistor (BJT).

11. The amplifier device according to claim 3, wherein the power element is a bipolar junction transistor (BJT), and the first bias element is a resistor, and the second bias element and the third bias element are respectively a diode.

12. An amplifier device, comprising:
an amplifying unit having a first end, a second end and a third end, wherein the first end of the amplifying unit is configured for electrically connecting to a voltage source, the second end of the amplifying unit is configured for receiving an input signal, the first end of the amplifying unit is configured for outputting an output signal amplified by the amplifying unit, and the third end of the amplifying unit is configured for electrically connecting to a first reference potential;
a bias module electrically connected to the second end of the amplifying unit for providing a bias voltage to the amplifying unit;
an impedance unit electrically connected to the bias module and received a control signal to make an impedance value of the impedance unit variable; and
a first adjusting module comprising:
a first amplifier having a first input end, a second input end and an output end;
a first resistor being connected between the first input end of the first amplifier and a third reference potential;
a second resistor being connected between the first input end of the first amplifier and the voltage source;
a third resistor being connected between the second input end of the first amplifier and the output end of the first amplifier; and
a fourth resistor being connected between the first reference voltage and the second input end of the first amplifier;
wherein the output end of the first amplifier outputs an output voltage as the control signal according to the voltage source and the first reference voltage to adjust the impedance value of the impedance unit;
wherein a voltage value of the voltage source is variable, the impedance value of the impedance unit is adjusted according to the voltage value of the voltage source.

13. The amplifier device according to claim 12, wherein the bias module includes:
a power element having a first end, a second end and a third end, wherein the first end of the power element is configured for electrically connecting to a bias voltage source, the third end of the power element is connected to the second end of the amplifying unit;
a first bias element having a first end and a second end, wherein the first end of the bias element is configured for electrically connecting to a reference power module, the second end of the first bias element is configured for electrically connecting to the second end of the power element;
a second bias element having a first end and a second end, wherein the first end of the second bias element is electrically connected to the second end of the first bias element; and
a third bias element having a first end and a second end, wherein the first end of the third bias element is connected to the second end of the second bias element, the second end of the third bias element is configured for electrically connecting to a second reference potential.

14. The amplifier device according to claim 12, further comprising a first default capacitor having a first end and a second end, wherein the first end of the first default capacitor is electrically connected to the bias module, the second end of the first default capacitor is configured for connecting to an impedance unit.

15. An amplifier device, comprising:
an amplifying unit having a first end, a second end and a third end, wherein the first end of the amplifying unit is configured for connecting to a voltage source, the second end of the amplifying unit is configured for receiving an input signal, the first end of the amplifying unit is configured for outputting an output signal amplified by the amplifying unit, and the third end of the amplifying unit is configured for connecting to a first reference potential;
a bias module electrically connected to the second end of the amplifying unit for providing a bias voltage to the amplifying unit, wherein the bias module includes:
a power element having a first end, a second end and a third end, wherein the first end of the power element is configured for electrically connecting to a bias voltage source, the third end of the power element is connected to the second end of the amplifying unit; and
a first bias element having a first end and a second end, wherein the first end of the bias element is configured for electrically connecting to a reference power module, the second end of the first bias element is electrically connected to the second end of the power element and is configured for providing a variable current to the second end of the power element;

an impedance unit electrically connected to the bias module and received a control signal to make an impedance value of the impedance unit variable; and a first adjusting module comprising:
- a first amplifier having a first input end, a second input end and an output end;
- a first resistor being connected between the first input end of the first amplifier and a third reference potential;
- a second resistor being connected between the first input end of the first amplifier and the voltage source;
- a third resistor being connected between the second input end of the first amplifier and the output end of the first amplifier; and
- a fourth resistor being connected between the first reference voltage and the second input end of the first amplifier;
- wherein the output end of the first amplifier outputs an output voltage as the control signal according to the voltage source and the first reference voltage to adjust the impedance value of the impedance unit;

wherein the impedance value of the impedance unit and the current value of the variable current are adjusted according to a power of the input signal, a power of the output signal or an operation mode of the amplifier device, to adjust a linearity of the amplifier device.

16. The amplifier device according to claim 15, wherein the bias module includes:
- a second bias element having a first end and a second end, wherein the first end of the second bias element is electrically connected to the second end of the first bias element; and
- a third bias element having a first end and a second end, wherein the first end of the third bias element is electrically connected to the second end of the second bias element, the second end of the third bias element is configured for electrically connecting to a second reference potential.

17. The amplifier device according to claim 15, wherein the first bias element includes a variable resistor, and the impedance unit includes a variable capacitor, a variable resistor, a variable inductor or a switch element.

18. The amplifier device according to claim 15, further comprising a first default capacitor having a first end and a second end, wherein the first end of the first default capacitor being electrically connected to the bias module, the second end of the first default capacitor being connected to the impedance unit, the impedance unit is configured for electrically connecting to a second reference potential.

* * * * *